United States Patent
Lin et al.

(10) Patent No.: US 9,299,528 B2
(45) Date of Patent: Mar. 29, 2016

(54) METHOD FOR MANUFACTURING PCB

(75) Inventors: Wen-Hsin Lin, Hsin-Chu (TW);
Ching-Kun Lai, Hsin-Chu (TW);
Chien-Hung Chen, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 918 days.

(21) Appl. No.: 13/523,990

(22) Filed: Jun. 15, 2012

(65) Prior Publication Data

US 2012/0246926 A1 Oct. 4, 2012

Related U.S. Application Data

(62) Division of application No. 12/434,756, filed on May 4, 2009, now abandoned.

(30) Foreign Application Priority Data

Dec. 30, 2008 (TW) ................................ 97151471 A (51) Int. Cl.
*H05K 3/36* (2006.01)
*H01J 9/24* (2006.01)
(Continued)

(52) U.S. Cl.
CPC .............. *H01J 9/241* (2013.01); *H05K 3/0058* (2013.01); *H05K 3/341* (2013.01); *H05K 2201/10318* (2013.01); *H05K 2201/10409* (2013.01); *H05K 2203/167* (2013.01); *Y02P 70/613* (2015.11);
(Continued)

(58) Field of Classification Search
CPC .......... H01J 9/241; H05K 2201/10409; H05K 2203/167; H05K 2201/10318; H05K 3/0058; H05K 3/341

USPC ............ 29/830–834, 729, 841–842; 174/255, 174/260–264
See application file for complete search history.

(56) References Cited

U.S. PATENT DOCUMENTS

| 5,302,778 A | * | 4/1994 | Maurinus ....................... 174/521 |
| 5,955,888 A | * | 9/1999 | Frederickson et al. .. 324/750.25 |
| 6,007,357 A | | 12/1999 | Perino et al. |

(Continued)

FOREIGN PATENT DOCUMENTS

| TW | 540287 | 7/2003 |
| TW | M268602 | 6/2005 |

(Continued)

OTHER PUBLICATIONS

English translation of abstract and pertinent parts of TW I253318.

(Continued)

*Primary Examiner* — Minh Trinh
(74) *Attorney, Agent, or Firm* — McClure, Qualey & Rodack, LLP (57) ABSTRACT

A method for manufacturing a printed circuit board is disclosed, which comprises the following steps. A basic board having an upper surface and a bottom surface opposite to the upper surface is provided. A plurality of the electronic components temporarily disposed on the basic board is provided. At least one locating pin temporarily disposed on a place of the basic board is provided, in which the electronic components are not temporarily disposed on the place. Surface mount technology is used simultaneously to joint at least one locating pin and the electronic components on the basic board.

12 Claims, 6 Drawing Sheets

(51) Int. Cl.
*H05K 3/00* (2006.01)
*H05K 3/34* (2006.01)

(52) U.S. Cl.
CPC ........ *Y10T 29/4913* (2015.01); *Y10T 29/49128* (2015.01)

(56) References Cited

U.S. PATENT DOCUMENTS

| | | | |
|---|---|---|---|
| 6,198,172 B1 | 3/2001 | King et al. | |
| 6,499,215 B1* | 12/2002 | Hoffmeyer et al. | 29/840 |
| 6,963,085 B2 | 11/2005 | Chou | |
| 6,963,143 B2 | 11/2005 | Howarth | |
| 7,164,586 B2 | 1/2007 | Lin | |
| 7,426,116 B1 | 9/2008 | Peng | |
| 7,872,701 B2 | 1/2011 | Yu et al. | |
| 2002/0042988 A1* | 4/2002 | Jansson | 29/832 |
| 2002/0152609 A1* | 10/2002 | Choi et al. | 29/830 |
| 2005/0264982 A1 | 12/2005 | Kim et al. | |
| 2006/0040529 A1 | 2/2006 | Kuo et al. | |

FOREIGN PATENT DOCUMENTS

| | | |
|---|---|---|
| TW | I253318 | 4/2006 |
| TW | M304185 | 1/2007 |
| TW | M317320 | 8/2007 |
| TW | M329179 | 3/2008 |
| TW | I298409 | 7/2008 |

OTHER PUBLICATIONS

English translation of abstract and pertinent parts of TW I298409.
English translation of abstract and pertinent parts of TW M329179.
English translation of abstract of TW M268602.
English translation of abstract of TW M317320.
English translation of abstract of TW M304185.
English translation of abstract of TW 540287.

* cited by examiner

METHOD FOR MANUFACTURING PCB

RELATED APPLICATIONS

The present application is a divisional of U.S. application Ser. No. 12/434,756, filed on May 4, 2009, which was based on, and claims priority from, Taiwan Patent Application Serial Number 97151471, filed Dec. 30, 2008, the disclosure of which is hereby incorporated by reference herein in its entirely.

BACKGROUND

1. Field of Invention

The present invention relates to a method for manufacturing a circuit board and the display module. More particularly, the present invention relates to a method for manufacturing a printed circuit board, a display module with the printed circuit board, and a method for fabricating the display module.

2. Description of Related Art

Rapid development in digital information and multimedia technologies and applications as well as the rapid technological advances in displays, a rapid increase in display applications has occurred in both the office and the home for example. People now expect high-quality displays. Flat panel displays have many advantages when compared to traditional cathode ray tube displays (CRT). Flat panel displays with thin thickness, are smaller, lighter and so forth.

Flat panel displays have been rapidly adopted by consumers because they are lighter, thinner, smaller, occupy less space and provide higher quality images than traditional cathode ray tube (CRT) displays. Flat panel display models all come with backboards on to which the printed circuit board is attached. To this end the backboard typically has some screw holes so that the printed circuit board can be screwed on to the backboard to prevent the printed circuit board from being moved before the shield plate is locked. However, the orientation of the printed circuit board may be shifted as a result of screwing screws into the screw holes to secure the printed circuit board on to the backboard. Therefore, it is difficult to fabricate the display module when the orientation of the printed circuit board is shifted.

Alternatively, the backboard has locating pins, so that the printed circuit board is temporarily fixed on the backboard to prevent the printed circuit board from moving before the shield plate is locked. However, the varied printed circuit boards are not of uniform size and have varied configurations, so that the varied printed circuit boards cannot share the same backboard locating pins.

In view of above, there is a need in the related field to allow the varied printed circuit boards to share one backboard, and to avoid shifting the printed circuit board when the printed circuit board is screwed.

SUMMARY

The following presents a simplified summary of the invention in order to provide a basic understanding to the reader. This summary is not an extensive overview of the invention and it does not identify key/critical elements of the present invention or delineate the scope of the present invention. Its sole purpose is to present some concepts disclosed herein in a simplified form as a prelude to the more detailed description that is presented later.

In one aspect, the present invention is directed to a method for manufacturing a printed circuit board.

In accordance with an embodiment of the present invention, the method for manufacturing the printed circuit board comprises the following steps. A basic board with an upper surface and a bottom surface is provided; electronic components are temporarily disposed on the basic board; at least one locating pin is temporarily disposed on at a specified position on the basic board, wherein the electronic components are permanently and not temporarily disposed on the basic board; the locating pin and the electronic components are simultaneously jointed on the basic board with surface mount technology.

Accordingly, the printed circuit board having the locating pin is manufactured. Thus, the printed circuit board is temporarily fixed on the backboard of the display module by means of its locating pin.

In another aspect, the present invention is directed to a display module.

In accordance with another embodiment of the present invention, the display module comprises a backboard, a display component and a printed circuit board with at least one locating pin formed thereon. The backboard has at least one locating hole. The display component is disposed on the backboard. The at least one locating pin is inserted in the locating hole.

Accordingly, each of the varied printed circuit boards is temporarily fixed on the backboard of the display module by means of its locating pin inserted in the locating hole without screws. Moreover, the varied locating holes matching the varied printed circuit boards are formed on the backboard beforehand, so that the displacement of varied printed circuit boards 300 is not affected, and whereby the cost is reduced.

In yet another aspect, the present invention is directed to a method for fabricating a display module.

In accordance with yet another embodiment of the present invention, the method for fabricating the display module comprises the following steps: a printed circuit board with at least one locating pin formed thereon is provided, and the printed circuit board is positioned on a backboard of a display module by means of the locating pin.

Accordingly, the locating pin is capable of assisting the printed circuit board in position without the screw.

Many of the attendant features will be more readily appreciated, as the same becomes better understood by reference to the following detailed description considered in connection with the accompanying drawings.

BRIEF DESCRIPTION OF THE DRAWINGS

The present description will be better understood from the following detailed description read in light of the accompanying drawings, wherein.

Like reference numerals are used to designate like parts in the accompanying drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

One aspect of the present invention is directed to a method for manufacturing a printed circuit board. The method can manufacture the printed circuit board for a display module and may be applicable or readily adaptable to all technologies. It should be noted that the printed circuit board having a locating pin is manufactured by using the method. Herewith the method for manufacturing the printed circuit board is illustrated by reference to the following description considered in FIG. 1, FIG. 2 and FIG. 3.

Figure 1:
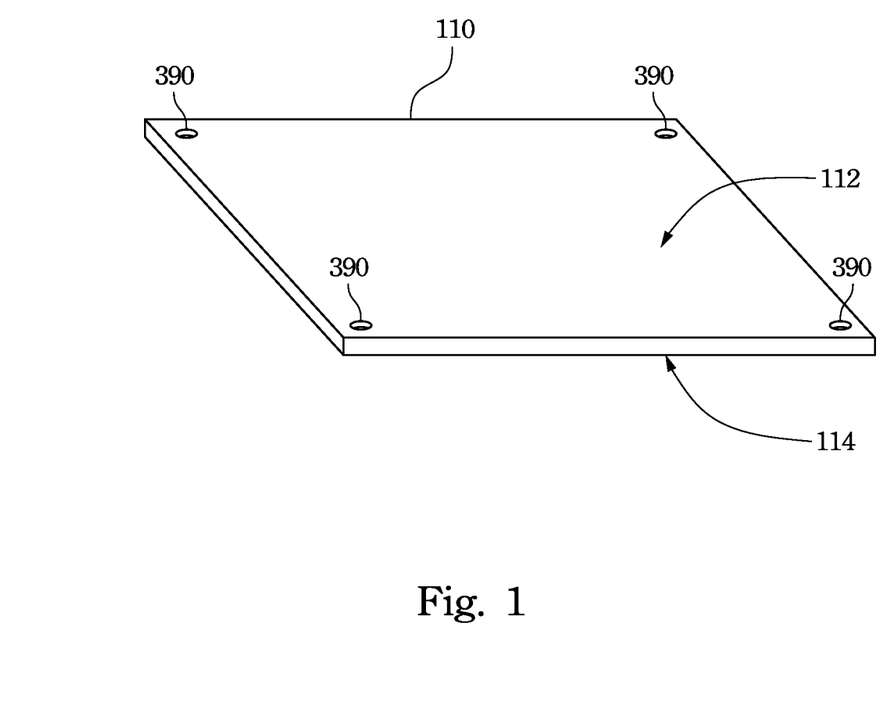
FIG. 1-3 illustrate intermediate stages in the manufacturing of a printed circuit board in accordance with an embodiment of the present invention.
Figure 2:
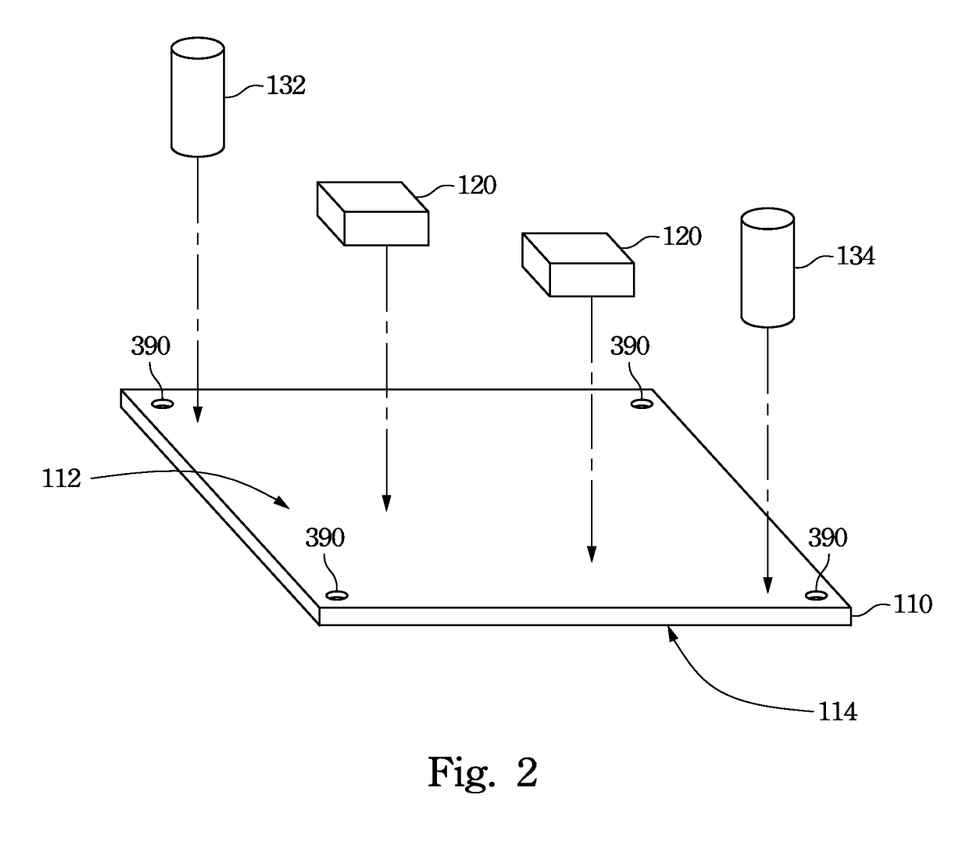
Figure 3:
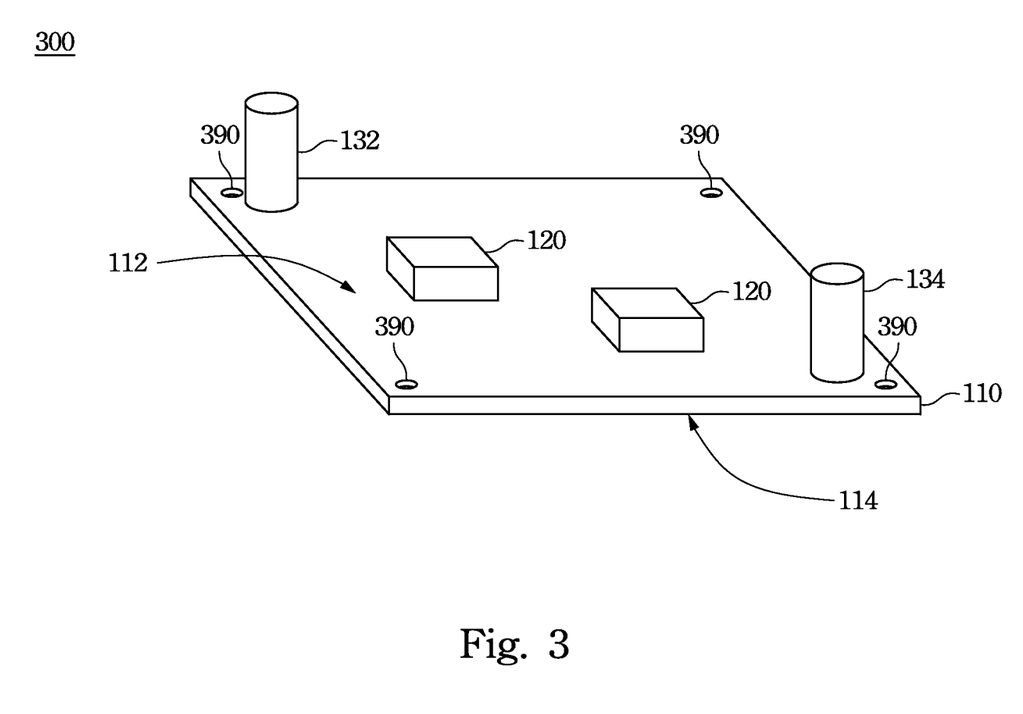

FIG. 1, FIG. 2 and FIG. 3 illustrate intermediate stages in the manufacturing of a printed circuit board in accordance with an embodiment of the present invention. Please refer to FIG. 1. In FIG. 1, a basic board 110 is provided. The basic board 110 has an upper surface 112 and a bottom surface 114, where the upper surface 112 is opposite to the bottom surface 114. Moreover, the basic board 110 comprises screw holes 390.

The basic board 110 may be made form material including characteristics of isolation, heat insulation and inflexibility. The material of the circuit, such as copper foil, is laid on the upper surface 112 and/or the bottom surface 114. During manufacture, the copper foil covers the entire surface of the basic board 110, and a portion of copper foil is etched to remain the circuit. The circuit acts as conducting wires for connect electronic components disposed on the basic board 110.

Please refer to FIG. 2. In FIG. 2, electronic components 120 temporarily disposed on the basic board 110 are provided. Moreover, at least one of the locating pins, such as a locating pin 132 and/or a locating pin 134, temporarily disposed on a place of the basic board 110 is provided, where the electronic components 120 are permanently and not temporarily disposed in place on the basic board 110.

In FIG. 2, two locating pin 132 and 134 are temporarily disposed near the different corners of the upper surface 112. In the preferred embodiment, the first locating pin 132 is temporarily disposed near a corner of the upper surface 112, and the second locating pin 134 is temporarily disposed near a diagonal corner that is opposite to the corner.

It should be noted that the electronic components 120 and the locating pins 132 and 134 are illustrated as temporarily disposed on the upper surface 112 of the basic board 110 for illustrative purposes only. In another embodiment, the locating pins 132 and 134 are temporarily disposed on the upper surface 112 of the basic board 110, and the electronic components 120 are temporarily disposed on the bottom surface 114 of the basic board 110; alternatively, a portion of the electronic components 120 and the locating pins 132 and 134 are temporarily disposed on the upper surface 114, and the other portion of the electronic components 120 are temporarily disposed on the bottom surface 114.

The manner of temporarily disposing the locating pins 132 and 134 and the electronic components 120 may comprise the following steps. First, solder is applied on the basic board 110; alternatively, viscose is dropped or applied on the basic board 110. Then, the locating pins 132 and 134 and the electronic components 120 is disposed on the solder or the viscose.

Please refer to FIG. 2. In FIG. 2, the locating pins 132 and 134 and the electronic components 120 are jointed on the basic board simultaneously by using surface mount technology. Accordingly, the printed circuit board 300 having the locating pins 132 and 134 is manufactured.

The manner of using surface mount technology may comprise the following steps. First, the locating pins 132 and 134 and the electronic components 120 are soldered on the basic board 110 by the way of roast or solder reflow. For example, after the reflow oven is set for heating, the locating pins 132 and 134 and the electronic components 120 are adhered on the solder that is applied on basic board 110; alternatively, the locating pins 132 and 134 and the electronic components 120 are adhered on the viscose that is dropped or applied on basic board 110. Thus, the locating pins 132 and 134 and the electronic components 120 are adhered on the basic board 110 via solder or viscose.

Accordingly, the locating pins 132 and 134 and the electronic components 120 are fixed on the basic board 110, such that the printed circuit board 300 having the locating pins 132 and 134 is manufactured. Thus, the printed circuit board 300 is temporarily fixed on the backboard of the display module by means of its locating pins 132 and 134 beforehand. Therefore, the printed circuit board 300 does not moved when screwing screws into the screw holes 390 to screw the printed circuit board 300 onto the backboard.

Another aspect of the present invention is directed to a display module including the printed circuit board 300. For a more complete understanding of the display module, herewith the display module is illustrated by reference to the following description considered in FIG. 4 and FIG. 5.

Figure 4:
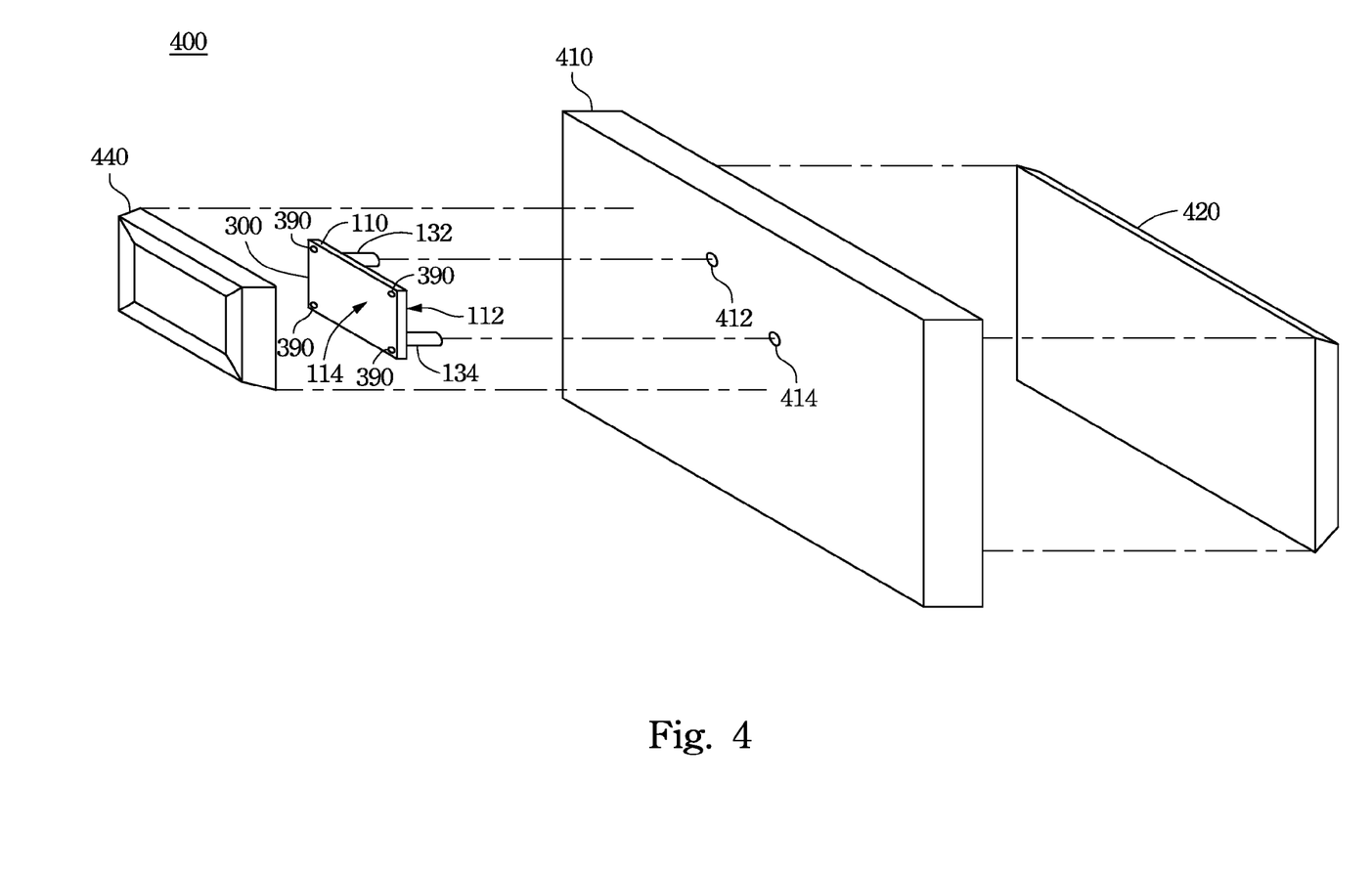
FIG. 4 is an explosion diagram of a display module in accordance with another embodiment of the present invention.

Please refer to FIG. 4. FIG. 4 is an explosion diagram of a display module 400 in accordance with another embodiment of the present invention. In FIG. 4, the display module 400 comprises the above printed circuit board 300, a backboard 410 and a display component 420. The display component 420 may be a flat screen, a liquid crystal display panel or the like.

The backboard 410 has at least one locating hole, such as a locating hole 412 and/or a locating hole 414. The display component 420 is disposed on the backboard 410. The printed circuit board 300 has at least one locating pin, such as a locating pin 132 and/or a locating pin 134, formed on the printed circuit board 300, wherein said at least one locating pin is inserted in the at least one locating hole. For instance, the locating pin 132 is inserted in the locating hole 412; additionally or alternatively, the locating pin 134 is inserted in the locating hole 414.

Accordingly, each of the varied printed circuit boards 300 is temporarily fixed on the backboard 410 of the display module 400 by means of its locating pins 132 and 134 inserted in the locating holes 412 and 414 without screws. Moreover, the varied locating holes 412 and 414 matching the varied printed circuit boards 300 are formed on the backboard 410 beforehand, so that the displacement of varied printed circuit boards 300 is not affected, and whereby the cost is reduced.

In FIG. 4, the printed circuit board 300 has the upper surface 112 and the bottom surface 114, and at least one locating pin, such as a first locating pin 132 and/or a second locating pin 134, is soldered on the upper surface 112, where the upper surface 112 faces the backboard 410, and the bottom surface 114 faces away from the backboard 410. One end of the first locating pin 132 and one end of the second locating pin 134 are soldered on the upper surface 112. The first locating pin 132 is soldered near a corner of the upper surface 112, and the second locating pin 134 is soldered near a diagonal corner that is opposite to the corner.

The printed circuit board 300 of FIG. 4 is the same as or similar to the printed circuit board 300 of FIG. 3. In FIG. 3, it should be noted that the electronic components 120 are illustrated as soldered on the upper surface 112 for illustrative purposes only. In another embodiment, the electronic components 120 are soldered on the bottom surface 114; alternatively, a portion of the electronic components 120 are soldered on the upper surface 114, and the other portion of the electronic components 120 are soldered on the bottom surface 114. Accordingly, the electronic components 120 are soldered on the printed circuit board 300.

In FIG. 4, the display module 400 comprises a shield plate 440. The shield plate 440 disposed on the backboard 410 for covering the printed circuit board 300. Thus, the shield plate 440 acts as a protective equipment to protect the printed circuit board 300.

Figure 5:
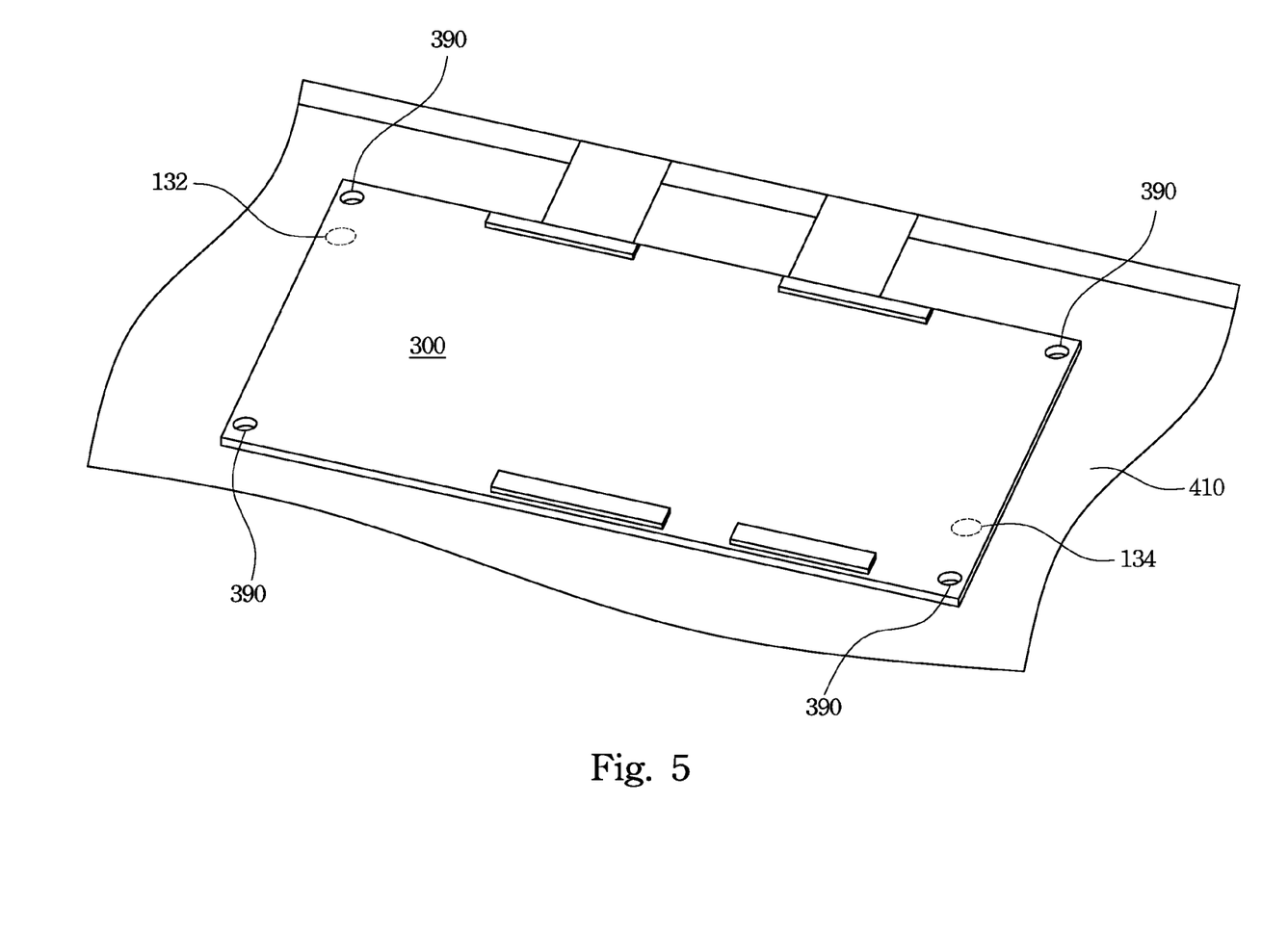
FIG. 5 illustrates the printed circuit board and the backboard of FIG. 4.

Please refer to FIG. 5. FIG. 5 illustrates the printed circuit board 300 and the backboard 410 of FIG. 4. The printed circuit board 300 has the locating pins 132 and 134 formed thereon. The locating pins 132 and 134 of the printed circuit board are positioned on the backboard 410 beforehand. In other words, the locating pins 132 and 134 are capable of assisting the printed circuit board 300 in position without the screw In FIG. 5, the printed circuit board 300 comprises the screw holes 390. The screw holes 390 correspond to the screw holes (not shown) of the backboard 410. The printed circuit board 300 is screwed on the backboard 410 after the printed circuit board 300 is set in position. Therefore, the printed circuit board 300 does not mover when screwing screws into the screw holes 390 to screw the printed circuit board 300 on the backboard 410. As a result the printed circuit board 300 is temporarily fixed on the backboard 410 beforehand by means of the locating pins 132 and 134.

Yet another aspect of the present invention is directed to a method for fabricating a display module. For a more complete understanding of the method for fabricating the display module, herewith the method is illustrated by reference to the following description considered in FIG. 6.

Figure 6:
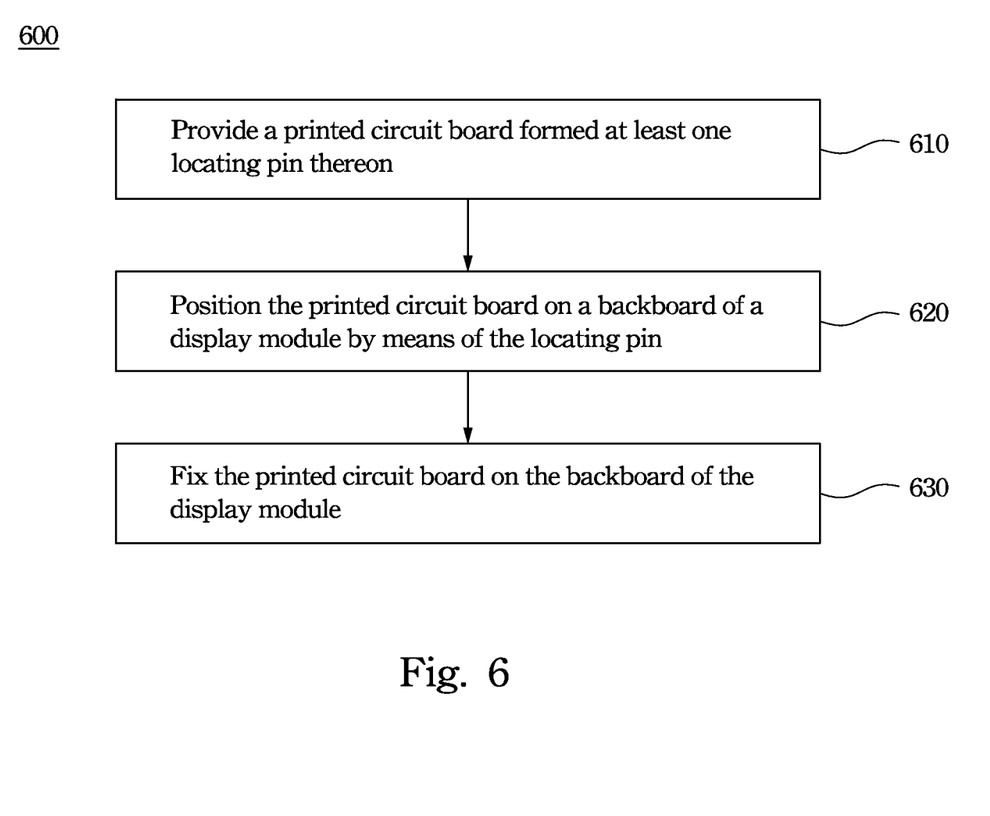
FIG. 6 is a flow chart of a method for fabricating a display module in accordance with yet another embodiment of the present invention.

Please refer to FIG. 6. FIG. 6 is a flow chart of a method 600 for fabricating a display module in accordance with yet another embodiment of the present invention. In FIG. 6, the method 600 comprises step 610 and step 620. In the method 600, it should be noted that one step might be performed in series, in parallel, in combination, or otherwise in conjunction with another if the specific order is not described or inferred in the embodiment.

In step 610, a printed circuit board with at least one locating pin formed thereon is provided; in step 620, the printed circuit board is positioned on a backboard of a display module by means of the locating pin.

Accordingly, the locating pin is capable of assisting the printed circuit board in position without the screw. The structure of the printed circuit board and the display module is described in the preceding embodiments and, thus, are not repeated herein.

During step 620, the at least one locating pin is inserted in at least one locating hole. Accordingly, the printed circuit board is temporarily disposed on the display module.

In FIG. 6, the method 600 further comprises step 630. In step 630, the printed circuit board is fixed on the backboard of the display module after the printed circuit board is positioned on the backboard. Accordingly, the printed circuit board is in position by means of the locating pin in step 620, so that the orientation of the printed circuit board is not shifted when the printed circuit board is fixed in step 630.

During step 630, the printed circuit board is screwed on the backboard of the display module. Accordingly, the orientation of the printed circuit board is not shifted during screwing screws into the screw holes of the printed circuit board to screw the printed circuit board on the backboard as a result in the printed circuit board temporarily fixed on the backboard beforehand by means of the locating pins in step 620.

The foregoing outlines features of several embodiments so that those skilled in the art may better understand the aspects of the present invention. Those skilled in the art should appreciate that they may readily use the present invention as a basis for designing or modifying other processes and structures for carrying out the same purposes and/or achieving the same advantages of the embodiments introduced herein. Those skilled in the art should also realize that such equivalent constructions do not depart from the spirit and scope of the present invention, and that they may make various changes, substitutions and alterations herein without departing from the spirit and scope of the present invention.

What is claimed is:

1. A method for manufacturing a printed circuit board, comprising:
providing a basic board having an upper surface and a bottom surface opposite to the upper surface;
providing a plurality of the electronic components temporarily disposed on the basic board;
providing at least two locating pins temporarily disposed on the basic board, wherein the locating pins are disposed at two opposite corners of the basic board where the electronic components aren't temporarily disposed at; and
simultaneously jointing the at least two locating pins and the electronic components on the basic board;
wherein the step of simultaneously jointing the at least two locating pins and the electronic components on the basic board comprises:
soldering the at least two locating pins and the electronic components on the basic board by the way of roast or solder reflow.

2. The method as claimed in claim 1, wherein providing the at least two locating pins comprises:
providing a first locating pin and a second locating pin temporarily disposed on the upper surface.

3. The method as claimed in claim 2, wherein the first locating pin is temporarily disposed near a corner of the upper surface, and the second locating pin is temporarily disposed near a diagonal corner opposite to the corner.

4. The method as claimed in claim 1, wherein the electronic components and the at least two locating pins are temporarily disposed on the upper surface.

5. The method as claimed in claim 1, wherein the at least two locating pins are temporarily disposed on the upper surface of the basic board, and the electronic components are temporarily disposed on the bottom surface.

6. The method as claimed in claim 1, wherein a portion of the electronic components and the at least two locating pins are temporarily disposed on the upper surface, and the other portion of the electronic components are temporarily disposed on the bottom surface.

7. The method as claimed in claim 1, wherein the step of soldering the at least two locating pins and the electronic components on the basic board by the way of roast or solder reflow comprises:
adhering the at least two locating pins and the electronic components on the solder applied on basic board with a help of a solder reflow oven.

8. The method as claimed in claim 1, wherein the step of providing a plurality of the electronic components temporarily disposed on the basic board comprises:
applying solder on the basic board; and
disposing the electronic components on the solder.

9. The method as claimed in claim 1, wherein the step of providing a plurality of the electronic components temporarily disposed on the basic board comprises:
   applying or dropping adhesive on the basic board; and
   disposing the electronic components on the adhesive.

10. The method as claimed in claim 1, wherein the step of simultaneously jointing the at least two locating pins and the electronic components on the basic board comprises:
    applying solder on the basic board; and
    disposing the at least two locating pins on the solder.

11. The method as claimed in claim 1, wherein the step of providing at least two locating pins temporarily disposed on a place of the basic board comprises:
    applying or dropping adhesive on the basic board; and
    disposing the at least two locating pins on the adhesive.

12. The method as claimed in claim 1, wherein the step of soldering the at least two locating pins and the electronic components on the basic board by the way of roast or solder reflow comprises:
    adhering the at least two locating pins and the electronic components on adhesive applied or dropped on basic board with a help of a solder reflow oven.

* * * * *